US010545693B2

(12) United States Patent
Torng et al.

(10) Patent No.: US 10,545,693 B2
(45) Date of Patent: *Jan. 28, 2020

(54) EMBEDDED MEMORY SUBSYSTEMS FOR A CNN BASED PROCESSING UNIT AND METHODS OF MAKING

(71) Applicant: GYRFALCON TECHNOLOGY INC., Milpitas, CA (US)

(72) Inventors: Chyu-Jiuh Torng, Dublin, CA (US); Lin Yang, Milpitas, CA (US); Qi Dong, San Jose, CA (US)

(73) Assignee: Gyrfalcon Technology Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/403,676

(22) Filed: May 6, 2019

(65) Prior Publication Data
US 2019/0258416 A1   Aug. 22, 2019

Related U.S. Application Data

(63) Continuation of application No. 15/477,263, filed on Apr. 3, 2017, now Pat. No. 10,331,367.

(51) Int. Cl.
*G06N 3/04* (2006.01)
*G06F 3/06* (2006.01)
(Continued)

(52) U.S. Cl.
CPC ............ *G06F 3/0629* (2013.01); *G06F 3/061* (2013.01); *G06F 3/0688* (2013.01); *G06F 13/16* (2013.01);
(Continued)

(58) Field of Classification Search
CPC ............... G06F 3/0629; G06F 13/4068; G06F 13/1668; G06F 3/0679; G06F 3/061;
(Continued)

(56) References Cited

U.S. PATENT DOCUMENTS 5,355,528 A * 10/1994 Roska .................. G06N 3/0635
706/38
5,717,834 A * 2/1998 Werblin ................. G06N 3/063
706/16

(Continued)

OTHER PUBLICATIONS

Zhao et al. "Design of MRAM based Logic Circuits and its Applications", Proceeding GLSVLSI '11 Proceedings of the 21st edition of the great lakes symposium on Great lakes symposium on VLSI pp. 431-436 Lausanne, Switzerland—May 2-4, 2011.

(Continued)

*Primary Examiner* — Khamdan N. Alrobaie (57) ABSTRACT

Embedded memory subsystems in a digital integrated circuit for artificial intelligence are disclosed. A semi-conductor substrate contains CNN processing units. Each CNN processing unit includes CNN logic circuits and an embedded memory subsystem. The memory subsystem includes first embedded memory and second embedded memory. The first embedded memory contains an array of MTJ STT-RAM cells with each cell has a circular planar area with a diameter in a range of 40-120 nm. The second embedded memory contains an array of MTJ STT-RAM cells with each cell has a circular planar area having a diameter in a range of 30-75 nm.

11 Claims, 7 Drawing Sheets

(51) Int. Cl.
  *G11C 11/16* (2006.01)
  *G06F 13/16* (2006.01)
  *G06F 13/40* (2006.01)
  *H01L 27/22* (2006.01)
  *H01L 43/08* (2006.01)
  *H01L 43/12* (2006.01)
  *G06N 3/063* (2006.01)

(52) U.S. Cl.
  CPC ........... *G06F 13/4068* (2013.01); *G06N 3/04* (2013.01); *G06N 3/0454* (2013.01); *G06N 3/063* (2013.01); *G11C 11/161* (2013.01); *H01L 27/222* (2013.01); *H01L 43/08* (2013.01); *H01L 43/12* (2013.01)

(58) Field of Classification Search
  CPC .............. G11C 11/161; G11C 11/1675; G11C 11/5607; G11C 11/1673; H01L 27/222; H01L 43/08; H01L 43/12; H01L 43/02; G06N 3/04
  See application file for complete search history.

(56) References Cited

U.S. PATENT DOCUMENTS

| | | | |
|---|---|---|---|
| 7,884,433 B2 | 2/2011 | Zhong et al. | |
| 8,183,061 B2 | 5/2012 | Zhong et al. | |
| 8,324,698 B2 | 12/2012 | Zhong et al. | |
| 8,772,051 B1 | 7/2014 | Zhong et al. | |
| 8,803,293 B2 | 8/2014 | Zhong et al. | |
| 8,933,542 B2 | 1/2015 | Zhong et al. | |
| 9,111,222 B2 * | 8/2015 | Aparin | G06N 3/0472 |
| 9,166,143 B1 | 10/2015 | Gan et al. | |
| 9,437,272 B1 | 9/2016 | Lu et al. | |
| 9,673,388 B2 | 6/2017 | Toh et al. | |
| 9,685,604 B2 | 6/2017 | Huang et al. | |
| 9,734,880 B1 * | 8/2017 | Augustine | G06N 3/049 |
| 9,767,557 B1 | 9/2017 | Gulsun et al. | |
| 9,940,534 B1 * | 4/2018 | Yang | G06K 9/4628 |
| 9,959,500 B1 * | 5/2018 | Torng | G06N 3/08 |
| 2006/0011958 A1 | 1/2006 | Jeong et al. | |
| 2007/0047294 A1 | 3/2007 | Panchula | |
| 2011/0273926 A1 | 11/2011 | Wu et al. | |
| 2012/0294076 A1 | 11/2012 | Lee et al. | |
| 2012/0294078 A1 | 11/2012 | Kent et al. | |
| 2014/0071741 A1 | 3/2014 | Kim et al. | |
| 2016/0218280 A1 | 7/2016 | Park et al. | |
| 2016/0225818 A1 | 8/2016 | Toh et al. | |
| 2016/0322090 A1 | 11/2016 | Chan et al. | |
| 2017/0039472 A1 | 2/2017 | Kudo | |
| 2017/0040531 A1 | 2/2017 | Chung et al. | |
| 2017/0092693 A1 | 3/2017 | Tan et al. | |
| 2017/0092851 A1 | 3/2017 | Han et al. | |
| 2017/0103298 A1 | 4/2017 | Liang et al. | |
| 2017/0103299 A1 | 4/2017 | Aydonat et al. | |
| 2017/0110653 A1 | 4/2017 | Seo et al. | |
| 2017/0125666 A1 | 5/2017 | Han et al. | |
| 2017/0148979 A1 | 5/2017 | Kim et al. | |
| 2017/0324025 A1 | 11/2017 | Lee et al. | |
| 2018/0137414 A1 | 5/2018 | Du et al. | |

OTHER PUBLICATIONS

Kodzuka et al. "Effects of boron composition on tunneling magnetoresistance ratio and microstructure of CoFeB/MgO/CoFeB pseudo-spin-valve magnetic tunnel junctions", Journal of Applied Physics 111, 043913 (2012).

Sze et al. "Hardware for Machine Learning: Challenges and Opportunities", Published at an invited conference paper at CICC 2017, Submitted on Dec. 22, 2016 (v1).

L. Thomas et al. "Basic Principles, Challenges and Opportunities of STT-MRAM for Embedded Memory Applications" MSST 2017—Santa Clara, May 17, 2017.

Kultursay et al. "Evaluating STT-RAM as an Energy-Efficient Main Memory Alternative", Published in: Performance Analysis of Systems and Software (ISPASS), 2013 IEEE International Symposium, Apr. 21-23, 2013.

Thomas, et al. Perpendicular spin transfer torque magnetic random access memories with high spin torque efficiency and thermal stability for embedded applications:, J. App. Physics 2014:115(17) 172615.

USPTO restriction requirement for U.S. Appl. No. 15/477,263 (parent case) dated Aug. 2, 2018.

USPTO office action for U.S. Appl. No. 15/477,263 (parent case) dated Sep. 7, 2018.

USPTO office action for U.S. Appl. No. 15/591,069 (related case) dated Sep. 7, 2018.

USPTO office action for U.S. Appl. No. 15/632,203 (related case) dated Sep. 20, 2018.

USPTO office action for U.S. Appl. No. 15/632,203 (related case) dated Feb. 26, 2019.

USPTO notice of allowance for U.S. Appl. No. 15/477,263 (parent case) dated Mar. 11, 2019.

USPTO notice of allowance for U.S. Appl. No. 15/591,069 (related case) dated Mar. 14, 2019.

USPTO notice of allowance for U.S. Appl. No. 15/632,203 (related case) dated Mar. 25, 2019.

* cited by examiner

| Target Material | Yield @ 600 ev | Sputtering Rate* (Å/sec) |
|---|---|---|
| Ag | 3.4 | 380 |
| Al | 1.2 | 170 |
| Au | 2.8 | 320 |
| Cr | 1.3 | 180 |
| Ir | 1.2 | 135 |
| Mg | 1.4 | 200 |
| Mo | 0.9 | 120 |
| Nb | 0.6 | 80 |
| Ru | 1.3 | 180 |
| Ta | 0.6 | 85 |
| Ti | 0.6 | 80 |
| TiN |  | 40 |
| W | 0.6 | 80 |
| Zr | 0.7 | 85 |

*FIG. 8*

EMBEDDED MEMORY SUBSYSTEMS FOR A CNN BASED PROCESSING UNIT AND METHODS OF MAKING

CROSS REFERENCE TO RELATED APPLICATIONS

This application is a continuation application to a co-pending U.S. patent application Ser. No. 15/477,263, filed on Apr. 3, 2017.

FIELD

The invention generally relates to the field of integrated circuit and more particularly to embedded memory subsystems configured for a CNN based processing unit and methods of making.

BACKGROUND

Cellular Neural Networks or Cellular Nonlinear Networks (CNN) have been applied to many different fields and problems including, but limited to, image processing since 1988. However, most of the prior art CNN approaches are either based on software solutions (e.g., Convolutional Neural Networks, Recurrent Neural Networks, etc.) or based on hardware that are designed for other purposes (e.g., graphic processing, general computation, etc.). As a result, CNN prior approaches are too slow in term of computational speed and/or too expensive thereby impractical for processing large amount of imagery data. The imagery data can be from any two-dimensional signals (e.g., a still photo, a picture, a frame of a video stream, etc.).

For a CNN based IC for artificial intelligence, data must be provided as close to the CNN processing logic. In addition, different characteristics of data may be required. For example, in image processing, filter coefficients and imagery data have different requirements. Filter coefficients need to be validly stored for long time, while the imagery data are written and read more often.

Prior art approaches have problems and shortfalls. For example, SRAM (Static RAM) was used for storing imagery data. Flash memory was used for storing filter coefficients. However, integrating different memory technologies/types on a single silicon chip is not practical. Therefore, a new approach would be desirable.

SUMMARY

This section is for the purpose of summarizing some aspects of the invention and to briefly introduce some preferred embodiments. Simplifications or omissions in this section as well as in the abstract and the title herein may be made to avoid obscuring the purpose of the section. Such simplifications or omissions are not intended to limit the scope of the invention.

For a CNN processing unit for either mobile co-processor or servo co-processor for processing large amount of input data (e.g., imagery data, voice data, etc.) Processing-in memory or memory-in processor are the most promising approach. Together with low power consumption, read/write speed and highly distributed on the same silicon are the three major requirements.

Embedded memory subsystems of a CNN based digital integrated circuit (IC) for artificial intelligence and methods of making are disclosed.

According to one aspect, A semi-conductor substrate contains CNN processing units. Each CNN processing unit includes CNN logic circuits and an embedded memory subsystem. The memory subsystem includes first memory and second memory. The first memory contains an array of MTJ STT-RAM cells with each cell has a circular planar area with a diameter in a range of 40-120 nm. The second memory contains an array of MTJ STT-RAM cells with each cell has a circular planar area having a diameter in a range of 30-75 nm. The first memory and the second memory can be configured for having same pitch or different pitch.

The CNN based digital IC further includes at least one input/output data bus operatively coupling the plurality of the CNN processing units via the embedded memory subsystem. The CNN based digital IC further includes a controller for controlling simultaneous operations of the plurality of CNN processing engines.

According to another aspect, the first memory is configured for storing data with high retention rate and imbalanced read/write similar to Flash memory. The second memory is configured for requiring balanced read/write with high endurance similar to static RAM (SRAM). In one embodiment for image processing, the first memory is for storing filter coefficients or weights while the second memory is for storing imagery data.

According to another aspect, fabrication method of an array of first magnetic tunnel junction (MTJ) elements and an array of second MTJ elements of an embedded memory subsystem in a digital integrated circuit containing a plurality of cellular neural networks (CNN) based processing units is disclosed. The fabrication method includes the following steps or operations: providing a metal substrate of CNN logic circuits in each CNN based processing unit; forming a via layer on the metal substrate for connecting the first MTJ elements and the second MTJ elements with respective copper landing pads, each first MTJ element having a first circular planar area and each second MTJ element having a second circular planar area; then forming a high selectivity layer (HSL) on the via layer, the HSL comprising an array of high selectivity circular pads for providing etching support for the first and the second MTJ elements; then forming MTJ layers on the HSL, the MTJ layers containing the first MTJ elements and the second MTJ elements in a vertically stacked lamination of horizontally parallel layers; and etching out unmasked portion of the MTJ layers to form the respective first MTJ elements and the respective second MTJ elements.

One object of the invention is to provide an embedded memory subsystem and CNN processing logic circuits on same Si, with low power, high distributed density, fast, flexible and can be manufactured with well-known technologies.

Other objects, features, and advantages of the invention will become apparent upon examining the following detailed description of an embodiment thereof, taken in conjunction with the attached drawings.

BRIEF DESCRIPTION OF THE DRAWINGS

These and other features, aspects, and advantages of the invention will be better understood with regard to the following description, appended claims, and accompanying drawings as follows:

DETAILED DESCRIPTIONS

In the following description, numerous specific details are set forth in order to provide a thorough understanding of the invention. However, it will become obvious to those skilled in the art that the invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or circuits representing one or more embodiments of the invention do not inherently indicate any particular order nor imply any limitations in the invention. Used herein, the terms "vertical", "horizontal", "planar", "parallel", "anti-parallel", "perpendicular", "plane", "elevation" are intended to provide relative positions for the purposes of description, and are not intended to designate an absolute frame of reference.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Embodiments of the invention are discussed herein with reference to FIGS. 1-8. However, those skilled in the art will readily appreciate that the detailed description given herein with respect to these figures is for explanatory purposes as the invention extends beyond these limited embodiments.

Figure 1:
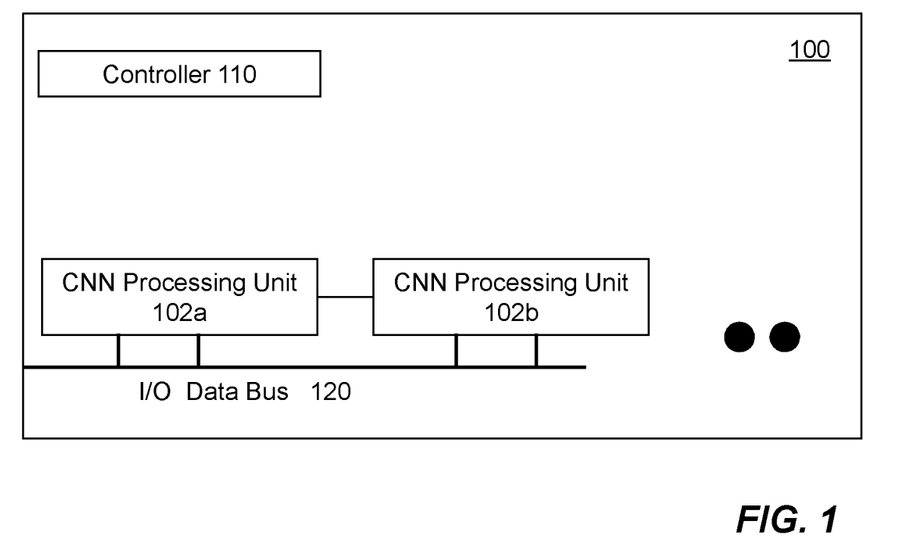
FIG. 1 is a block diagram illustrating an example CNN based IC for artificial intelligence in accordance with one embodiment of the invention.

Referring first to FIG. 1, it is shown a block diagram illustrating an example CNN based digital integrated circuit (IC) for artificial intelligence 100 for artificial intelligence (e.g., image processing, voice reorganization, etc.) In accordance with one embodiment of the invention.

The IC 100 is implemented as a digital semi-conductor chip (e.g., a silicon substrate) and contains a controller 110, and a plurality of CNN processing units 102a-102b operatively coupled to at least one input/output (I/O) data bus 120. Controller 110 is configured to control various operations of the CNN processing units 102a-102b, which are connected in a loop with a clock-skew circuit.

In one embodiment, the digital integrated circuit 100 is extendable and scalable. For example, multiple copy of the digital integrated circuit 100 can be implemented on a single semi-conductor chip.

Figure 2:
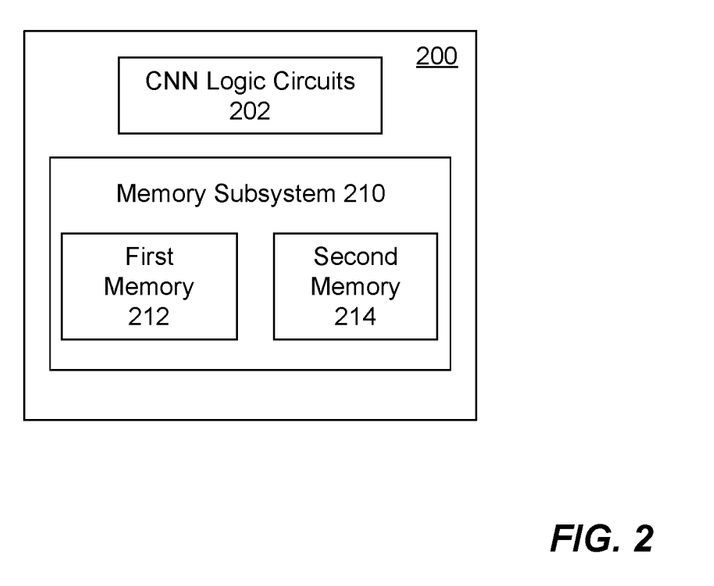
FIG. 2 is a function block diagram showing an example CNN processing unit including memory subsystem according to an embodiment of the invention.

All of the CNN processing units are identical. For illustrating simplicity, function block diagram of an example CNN processing unit 200 is shown in FIG. 2. The invention sets no limit to the number of CNN processing units on a digital semi-conductor chip.

Each CNN processing unit 200 contains CNN logic circuits 202, which is operatively coupled to an embedded memory subsystem 210. In other words, the memories of the embedded memory subsystem 210 and the CNN logic circuits 202 are located on the same digital semi-conductor chip. In one embodiment, CNN logic circuits 202 are configured for performing convolution operations of input signals with filter coefficients (or weights). In one embodiment, the input signals are imagery data. In another embodiment, the input signals are converted voice data.

Memory subsystem 210 is made of a first memory 212 and a second memory 214. The first memory 212 is configured for requiring data being stored with higher retention rate than the second memory 214. The second memory 214 is configured for higher endurance of balanced data read and write operations than the first memory 212. In one embodiment, the first memory 212 is for storing filter coefficients while the second memory 214 is for storing imagery data in an image processing application.

The first memory 212 contains an array of first spin transfer torque magnetic random access memory (STT-RAM) cells with each first STT-RAM cell containing a first magnetic tunnel junction (MTJ) element. The second memory 214 contains an array of second STT-RAM cells with each second STT-RAM cell containing a second MTJ element. In one embodiment, the first MTJ element and the second MTJ element are made of identical layers except their respective planar areas. The first MTJ element has a first circular planar area, which has a first diameter in a range of 40-120 nm (nanometer). The second MTJ element has a second circular planar area, which has a second diameter in a range of 30-75 nm.

Figure 3A:
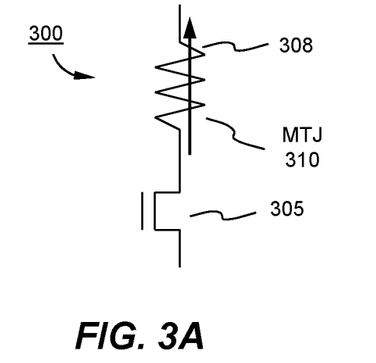
FIGS. 3A-3D are diagrams showing various features of an example STT-RAM being used for forming memory subsystem, according to an embodiment of the invention.

FIG. 3A is a schematic diagram showing components of an example STT-RAM cell 300. Each STT-RAM cell 300 contains one transistor 305 and one MTJ (Magnetic Tunnel Junction) element 310 located between source line (SL), bit line (BL) and word line (WL). A spin-polarized electric current 308 (shown as an arrow) is used for controlling (i.e., reading and writing) the state of MTJ element 310. In one embodiment, MTJ element operates in a Current Perpendicular to Plane configuration. This also referred to as perpendicular MTJ (PMTJ) element.

Figure 3B:
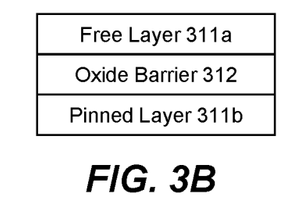
Figure 3C:
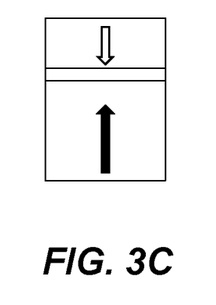
Figure 3D:
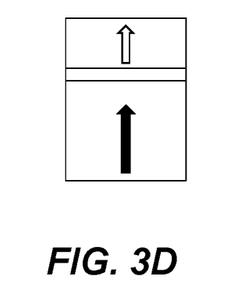

MTJ element 310 contains two ferromagnetic layers 311a-3111b located on either side of an oxide barrier layer 312 as shown in FIG. 3B. The first ferromagnetic layer's magnetization direction is switchable by the spin-polarized electric current, while the second ferromagnetic layer's magnetization direction is fixed and can provide the spin-polarized electric current for switching. Therefore, the first ferromagnetic layer is referred to as a free layer 311a and the second ferromagnetic layer is referred to as a pinned or fixed magnetic layer 311b. The relative direction of magnetization of free layer 311a and pinned layer 312b gives two different states (i.e., zero and one) of MTJ element 310. FIG. 3C shows an MTJ element having different magnetization directions (i.e., arrows having different directions) in free layer 311a and in pinned layer 311b, while FIG. 3D shows two layers having the same magnetization directions. In one embodiment, state "1" and state "0" are assigned to respective configurations in FIG. 3C and FIG. 3D.

STT-RAM cell uses a spin-polarized electric current 308 to write only to MTJ element that needs state changes. MTJ element magnetization switching occurs due to a transfer of angular momentum between the spins within the local magnetic moment and electrons passing through the MTJ element 310.

Other types of memory technology having substantially similar characteristics of STT-RAM cell may be used for forming the first memory cells and the second memory cells for a CNN based digital IC for artificial intelligence.

Figure 4A:
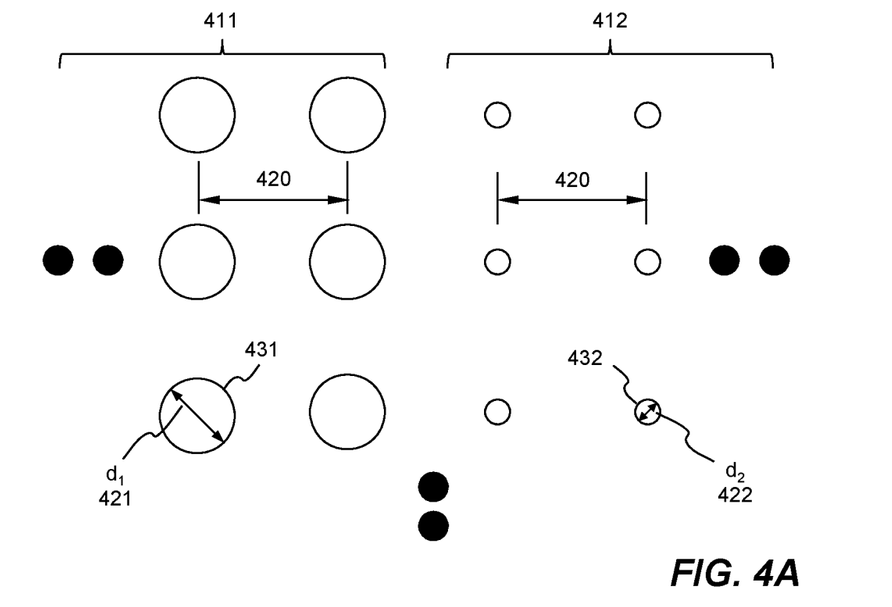
FIG. 4A is a plan view showing example first memory cells and example second memory cells with a same pitch, according to an embodiment of the invention.

FIG. 4A is a plan view showing an example array of first STT-RAM cells 411 and an example array of second STT-RAM cells 412 with the same constant pitch 420. Pitch is the distance between two identical features on a semi-conductor substrate. Each of the first STT-RAM cells 411 contains a first magnetic tunnel junction (MTJ) element 431, which has a circular planar area with a first diameter (i.e., $d_1$ 421). Each of the second STT-RAM cells 412 contains a second MTJ element 432, whose circular planar area has a second diameter (i.e., $d_2$ 422). Generally the first diameter 411 is larger than the second diameter 412. Larger planar area of an MTJ element allows data be retained longer (e.g., 6 months or more). Smaller area of an MTJ element allows faster and balanced read/write with lower energy (e.g., less electric current).

Figure 4B:
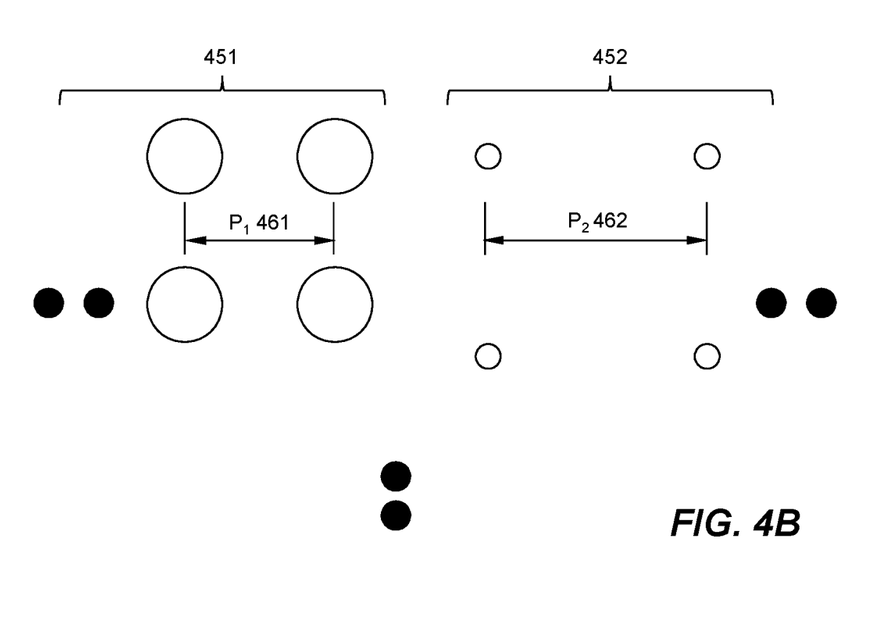
FIG. 4B is a plan view showing a portion of example first memory cells and example second memory cells with different pitches, according to an embodiment of the invention.

In another embodiment, the pitch of the first STT-RAM cells are different from the pitch of the second STT-RAM cells. FIG. 4B is a plan view showing an example array of first STT-RAM cells 451 and an example array of second STT-RAM cells 452 with different pitches. The array of the first STT-RAM cells 451 has a first pitch $P_1$ 461 while the array of the second STT-RAM cells 452 has a second pitch $P_2$ 462. In this example shown in FIG. 4B, the second pitch 462 is greater than the first pitch 461. One of the reasons for larger pitch is to house a larger capacity transistor for providing higher electric current for controlling an MTJ element.

Figure 5A:
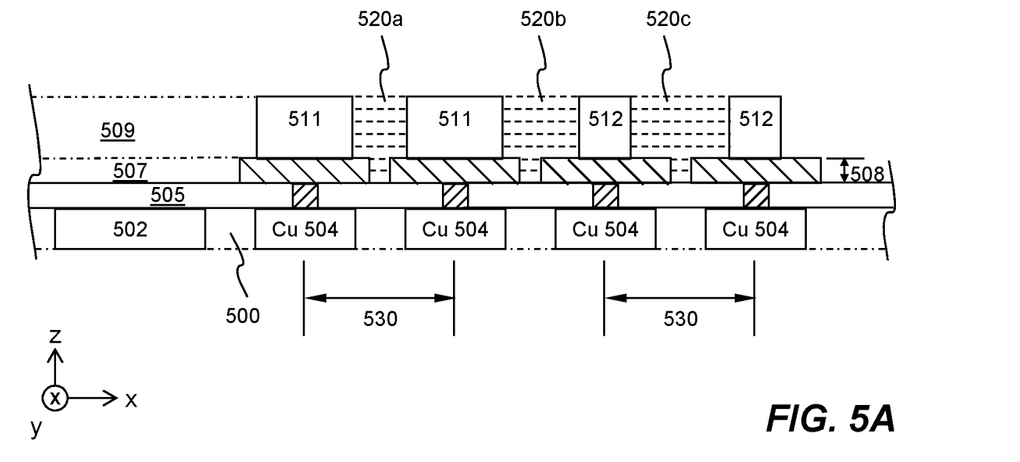
FIG. 5A is an elevation view showing relevant layers during fabrication of an array of example MTJ elements having constant pitch, according to an embodiment of the invention.
Figure 5B:
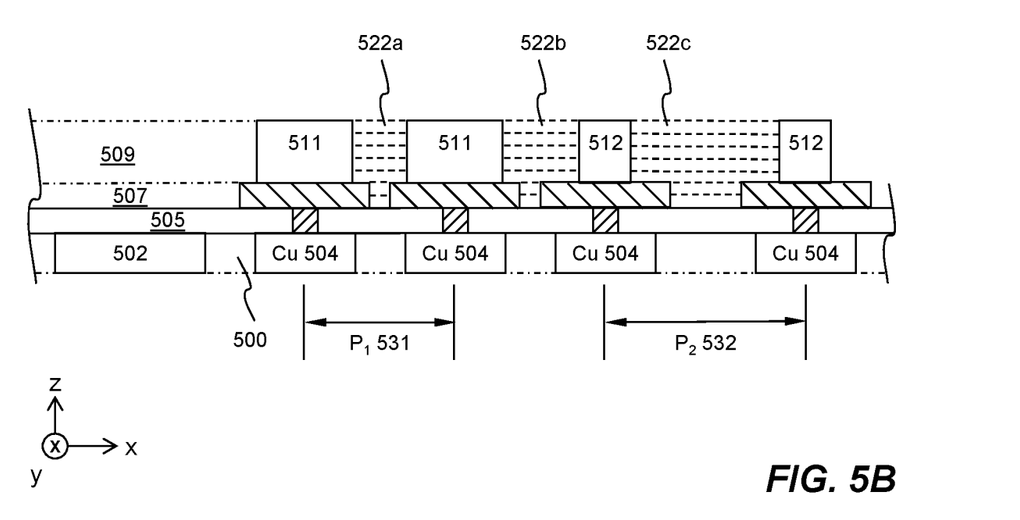
FIG. 5B is an elevation view showing relevant layers during fabrication of an array of example MTJ elements having different pitch, according to an embodiment of the invention.

The Cartesian coordinate system (x-y-z) in FIGS. 5A-5B shows that the vertical or "z" direction for thickness of each layer, while the "x-y" plane is the horizontal plane for each layer to be formed.

FIG. 5A is elevation view of first example layers of fabrication of MTJ elements with STT-RAM cells having a constant pitch 530. Metal layer or substrate 500 contains a plurality of copper landing pads 504 and metal lines for CNN logic circuits 502. Copper landing pads 504 correspond to transistors (not shown) for each of the first and the second STT-RAM cells. Forming on top of the metal layer 500 is a via layer 505. A high selectivity layer (HSL) 507 is formed on top of the via layer 505. HSL 507 has a thickness 508 in a range of 300-4000 Angstrom. Formed on top of the HSL 507 is an array of first MTJ elements 511 and an array of second MTJ elements 512. Only a few MTJs are shown for illustration simplicity and clarity. Unmasked portions 520a-520c are etched out thereafter.

Shown in FIG. 5B, another example layers showing STT-RAM cells having different pitches ($P_1$ 531 is smaller than $P_2$ 532). Having different pitch in the MTJ layers (i.e., first MTJ elements 511 and second MTJ elements 512), the unmasked portions 522a-522c are different. Larger pitch (e.g., $P_2$ 532) allows a larger transistor for providing higher current.

Figure 6A:
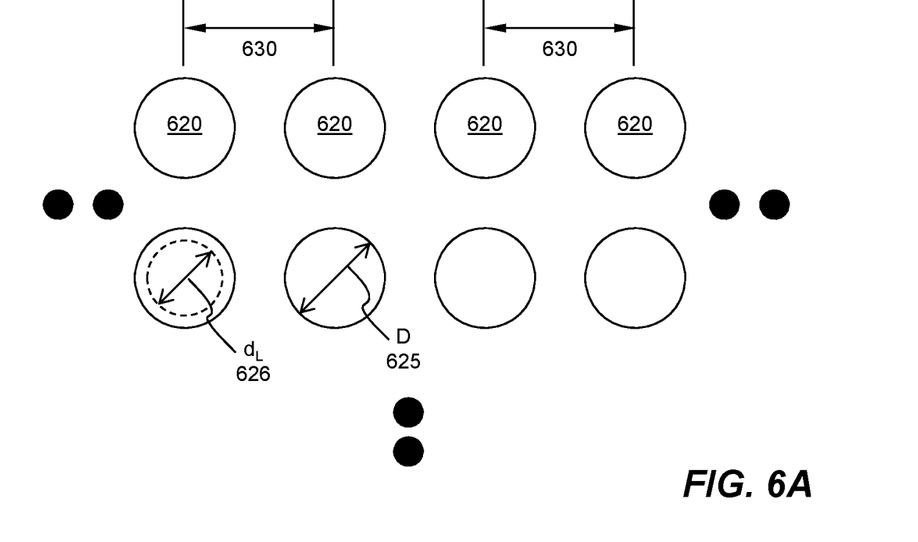
FIGS. 6A-6B are plan views showing respective high selectivity layers of FIG. 5A and FIG. 5B.
Figure 6B:
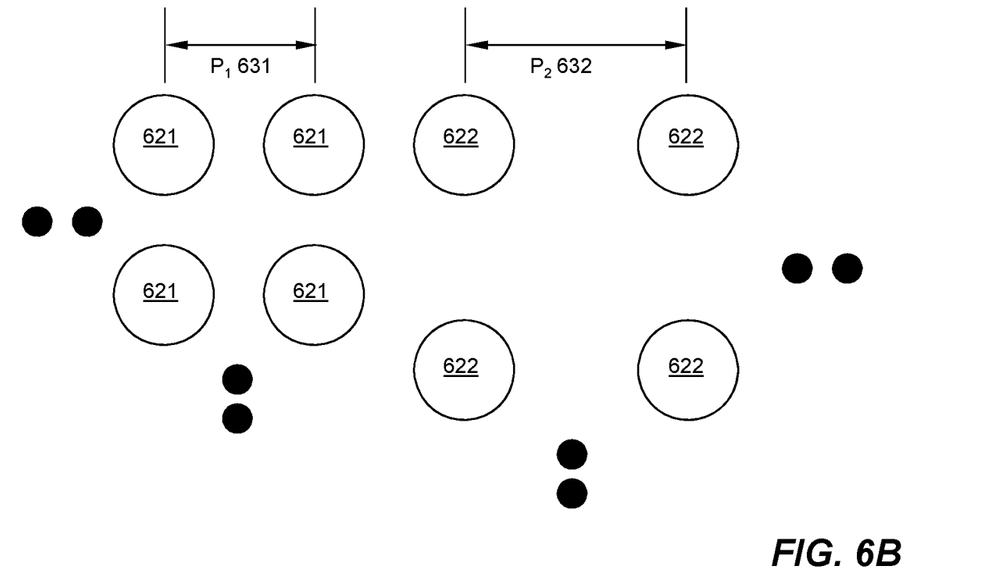

As a result, etching process of the unmasked portions 522a-522c require another layer (i.e., HSL 507 in form of high selectivity circular pads 620-622 shown in FIGS. 6A-6B) as an etching support such that the etching can be performed simultaneously for a smaller unmasked portion 522a and for a larger unmasked portion 522c.

Figure 7:
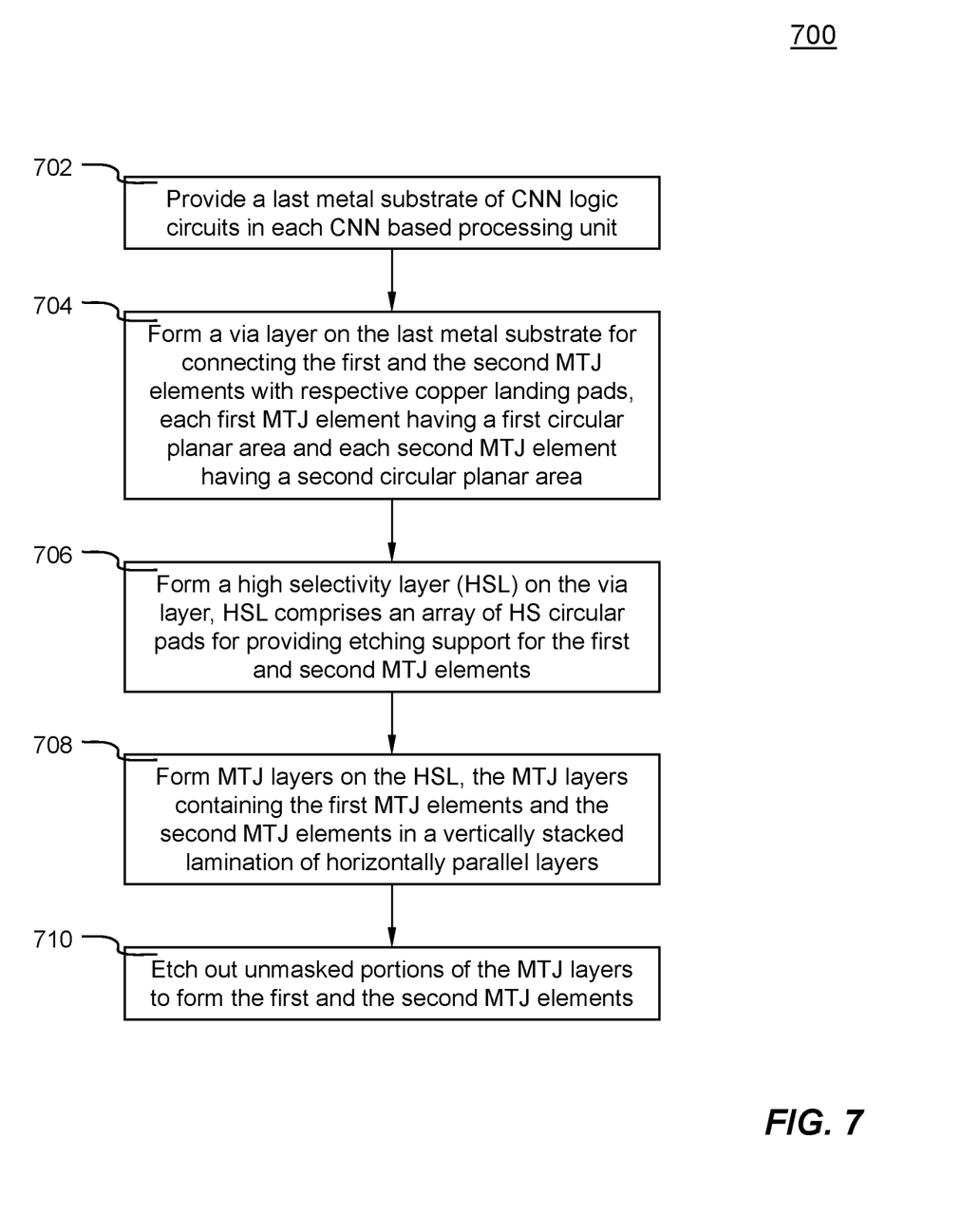
FIG. 7 is a flowchart illustrating an example process of fabricating an array of first magnetic tunnel junction (MTJ) elements and an array of second MTJ elements of an embedded memory subsystem in a CNN based IC for artificial intelligence, according to an embodiment of the invention.

FIG. 7 is a flowchart illustration an example process 700 of fabricating an array of first magnetic tunnel junction (MTJ) elements and an array of second MTJ elements of an embedded memory subsystem in a digital integrated circuit containing a plurality of CNN based processing units. Process 700 is understood with previous figures.

Process 700 starts at step 702 by providing a metal substrate 500 of CNN logic circuits in each CNN based processing unit and for all transistors for the first and the second STT-RAM cells. Next step 704, a via layer 505 is formed on the metal substrate for connecting the first MTJ elements 511 and the second MTJ elements 512 with respective copper landing pads 504. Each of the first MTJ elements 511 has a first circular planar area 431 and each of the second MTJ elements 512 has a second circular planar area 432. Then, at step 706, a high selectivity layer (HSL) 507 is formed on the via layer 505. HSL 507 contains an array of high selectivity circular pads 620 for providing etching support for forming the first and the MTJ elements 511-512. FIG. 6A shows a first example HSL containing an array of high selectivity circular pads 620 with constant or same pitch 630. In the second example HSL shown in FIG. 6B, there are two arrays of high selectivity circular pads 621-622. The first array has pitch $P_1$ 631 while the second array has pitch $P_2$ 632. Each high selectivity circular pad 620-622 has the area with a diameter D 625 equaling to 20-60 nm plus the larger of the two types of MTJ elements (i.e., & 626 is the larger of $d_1$ 421 and $d_2$ 422 of FIG. 4A).

Next, at step 708, MTJ layers 509 are formed on the HSL. MTJ layers 509 contains the first MTJ elements 511 and second MTJ elements 512 in a vertically stacked lamination of horizontally parallel layers (e.g., a bottom ferromagnetic layer 311*b*, an oxide barrier layer 312 and a top ferromagnetic layer 311*a*). Finally, at step 710, the unmasked portions 520*a*-520*c*, 522*a*-522*c* of the MTJ layers 509 are etched out and the first MTJ elements 511 and the second MTJ elements 512 are formed. The etching can be done with a number of techniques, for example, using a plasma process based on argon ions or other argon rich gases.

Figure 8:
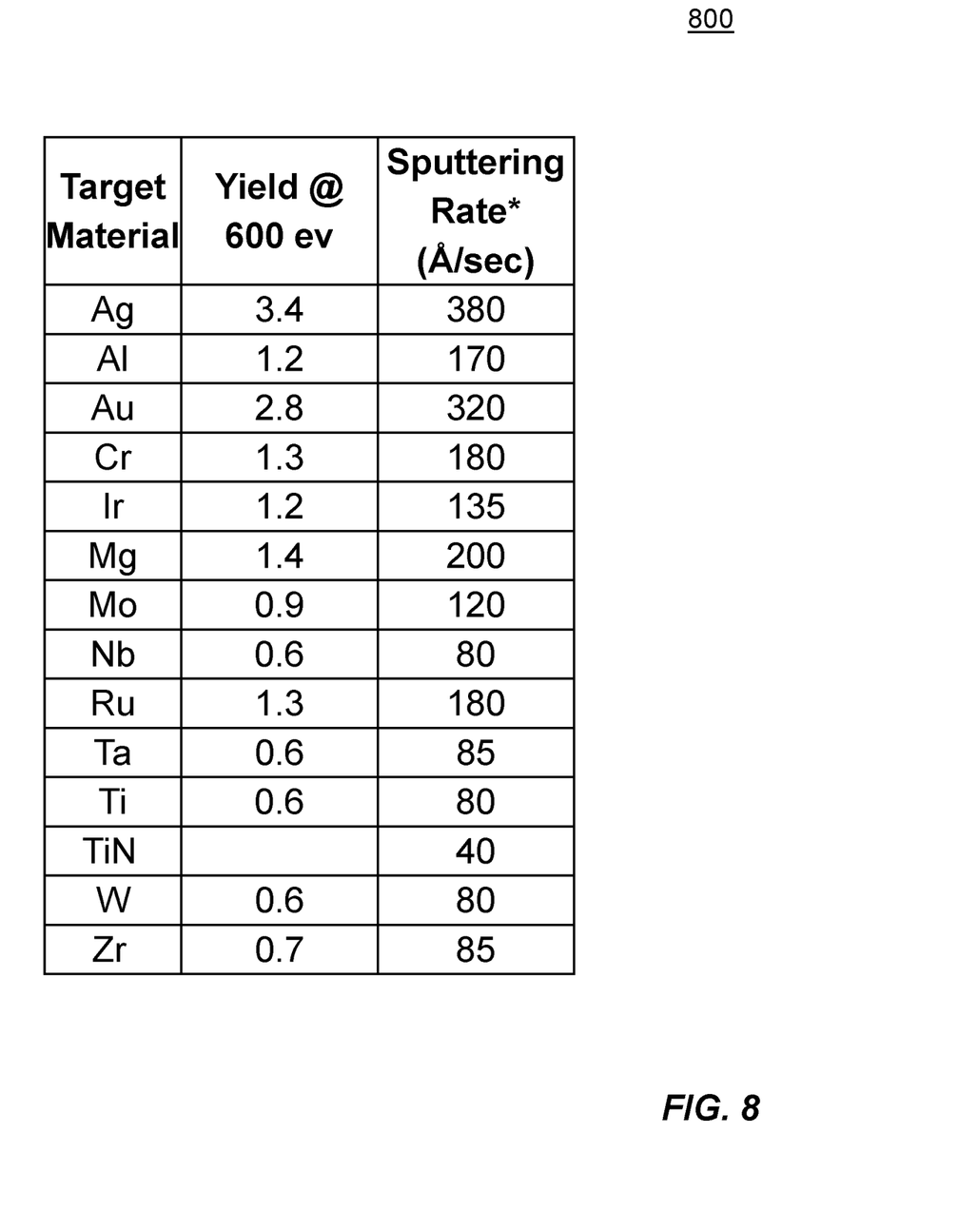
FIG. 8 is table summarizes properties of example materials that can be used in high selectivity layer during fabrication of the embedded memory subsystem of the CNN based IC for artificial intelligence, according to an embodiment of the invention.

FIG. 8 is a table 800 summarizes relevant properties of a number of materials that can be used in high selectivity layer during fabrication of the memory subsystem in accordance with one embodiment. During etching operation of the MTJ layers, HSL is added for providing the support. In one embodiment, materials having a sputtering rate less than 90 can be used in the HSL. According to table 800, any one or any combination of Nb, Ta, Ti, TiN, W and Cr would fit the criterion. In other words, HSL can contain two layers of different materials, for example, TiN/Nb, TiN/Ti, TiN/W, TiN/Zr and the likes.

Although the invention has been described with reference to specific embodiments thereof, these embodiments are merely illustrative, and not restrictive of, the invention. Various modifications or changes to the specifically disclosed exemplary embodiments will be suggested to persons skilled in the art. For example, whereas image processing has been shown and described as an example usage of the CNN based digital IC, other applications may be used, for example, voice recognition. Sound waves can be recorded and converted into a series of digital images (e.g., using fast Fourier Transform), whose features in turn can be extracted using a CNN based digital IC. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A digital semi-conductor chip for artificial intelligence comprising:
    a semi-conductor substrate containing integrated circuits of a plurality of cellular neural networks (CNN) processing units;
    each CNN processing unit comprising CNN logic circuits, a first embedded memory, and a second embedded memory;
    the first embedded memory containing an array of first spin transfer torque magnetic random access memory (STT-RAM) cells with each first STT-RAM cell having a first magnetic tunnel junction (MTJ) element located on a first transistor;
    the second embedded memory containing an array of second STT-RAM cells with each second STT-RAM cell having a second MTJ element located on a second transistor; and
    the CNN logic circuits further comprising at least a metal layer that includes a plurality of copper landing pads providing as the first and the second transistors.

2. The digital integrated circuit of claim 1, further comprises at least one input/output data bus operatively coupling the plurality of the CNN processing units via the first embedded memory and the second embedded memory and a controller for controlling operations of the plurality of CNN processing units.

3. The digital integrated circuit of claim 2, wherein the semi-conductor substrate comprises a silicon substrate.

4. The digital integrated circuit of claim 2, wherein the first embedded memory is configured for requiring data being stored with higher retention rate than the second embedded memory.

5. The digital integrated circuit of claim 2, wherein the second embedded memory is configured for higher endurance of balanced data read and write operations than the first embedded memory.

6. The digital integrated circuit of claim 1, wherein each of the first MTJ element and the second MTJ element is made of two ferromagnetic layers located on either side of an oxide barrier layer orientated vertically.

7. The digital integrated circuit of claim 1, wherein each of the first MTJ element and the second MTJ element operates in a Current Perpendicular to Plane configuration.

8. The digital integrated circuit of claim 1, wherein the first MTJ element has a circular planar area with a first diameter in a range of 40-120 nm and the second MTJ element has a circular planar area with a second diameter in a range of 30-75 nm.

9. The digital integrated circuit of claim 1, wherein the first embedded memory and the second embedded memory have a same pitch.

10. The digital integrated circuit of claim 1, wherein the first memory and the second embedded memory have different pitches.

11. The digital semi-conductor chip for artificial intelligence of claim 1, wherein the first transistor and the second transistor are independent with each other.

* * * * *